United States Patent
Matsumoto

(10) Patent No.: US 11,270,865 B2
(45) Date of Patent: Mar. 8, 2022

(54) MULTI-CHARGED PARTICLE BEAM WRITING APPARATUS AND MULTI-CHARGED PARTICLE BEAM WRITING METHOD

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/166,070

(22) Filed: Feb. 3, 2021

(65) Prior Publication Data
US 2021/0257185 A1    Aug. 19, 2021

(30) Foreign Application Priority Data
Feb. 18, 2020  (JP) .............................. JP2020-025337

(51) Int. Cl.
*H01J 37/24*  (2006.01)
*H01J 37/20*  (2006.01)
(Continued)

(52) U.S. Cl.
CPC ............ *H01J 37/24* (2013.01); *H01J 37/045* (2013.01); *H01J 37/1472* (2013.01);
(Continued)

(58) Field of Classification Search
CPC ........ H01J 37/24; H01J 37/20; H01J 37/1472; H01J 37/3026; H01J 37/304; H01J 37/045; H01J 37/3177; H01J 37/3175; H01J 2237/30472; H01J 2237/202; H01J 2237/31774; H01J 2237/0435; H01J 2237/31764
(Continued)

(56) References Cited

U.S. PATENT DOCUMENTS 5,260,579 A    11/1993  Yasuda et al.
2010/0252733 A1  10/2010  Platzgummer
(Continued)

FOREIGN PATENT DOCUMENTS

JP    5-166707 A    7/1993
JP    2008-252095 A   10/2008
(Continued)

*Primary Examiner* — Kiet T Nguyen
(74) *Attorney, Agent, or Firm* — Oblon, McClelland, Maier & Neustadt, L.L.P.

(57) ABSTRACT

A multi-charged particle beam writing apparatus includes a movable stage to mount a substrate thereon, a shot data generation circuit to generate shot data of each shot of multiple charged particle beams, a shift amount calculation circuit to calculate a shift amount for collectively correcting positions of all of the multiple charged particle beams of the k-th shot, based on parameters related to at least the (k+1)th and subsequent shots (k being a natural number) of the multiple charged particle beams, and a writing mechanism including a deflector for deflecting the multiple charged particle beams, and to perform the k-th shot onto the substrate with the multiple charged particle beams while shifting the all of the multiple charged particle beams of the k-th shot by collective deflection according to the shift amount.

11 Claims, 15 Drawing Sheets

(51) Int. Cl.
  *H01J 37/147* (2006.01)
  *H01J 37/317* (2006.01)
  *H01J 37/302* (2006.01)
  *H01J 37/304* (2006.01)
  *H01J 37/04* (2006.01)

(52) U.S. Cl.
  CPC ............ *H01J 37/20* (2013.01); *H01J 37/304* (2013.01); *H01J 37/3026* (2013.01); *H01J 37/3175* (2013.01); *H01J 37/3177* (2013.01); *H01J 2237/0435* (2013.01); *H01J 2237/202* (2013.01); *H01J 2237/30472* (2013.01); *H01J 2237/31764* (2013.01)

(58) Field of Classification Search
  USPC .................................................... 250/492.22
  See application file for complete search history.

(56) References Cited

U.S. PATENT DOCUMENTS

| | | |
|---|---|---|
| 2015/0340196 A1 | 11/2015 | Matsumoto et al. |
| 2016/0155604 A1 | 6/2016 | Matsumoto |
| 2020/0135428 A1* | 4/2020 | Matsumoto ......... H01J 37/3023 |

FOREIGN PATENT DOCUMENTS

| | | | |
|---|---|---|---|
| JP | 2015-228471 A | 12/2015 | |
| JP | 2016-1725 A | 1/2016 | |

* cited by examiner

Beam position deviation and/or defocusing are generated

| Cause | Place Where Deviation Occurs | Related Parameter | Correction Amount Calculation Method |
|---|---|---|---|
| Charged Deflector | Objective Deflector | Pattern Density, Dose Density | Correlation of Pattern Density, Dose Density, and Beam Array Shift Amount (x, y) |
| Coulomb Effect | Crossover Close to Target Object Surface | "ON" Beam Distribution for Each Sub-Shot in Shot Dividing System | Correlation of "ON" Beam Amount and Center of Gravity, and Beam Array Shift Amount (x, y) |
| | | Dose Distribution for Each Shot in Counter System | Correlation of Total Dose, Center of Gravity, and Beam Array Shift Amount (x, y) |
| Magnetic Field due to Blanking Operation | Close to Blanking Device | Shot Cycle "ON" Beam Amount | Correlation between Shot Cycle and Beam Array Shift Amount (x, y) Correlation between "ON" Beam Amount at Fixed Shot Cycle and Beam Array Shift Amount (x, y) |

44%
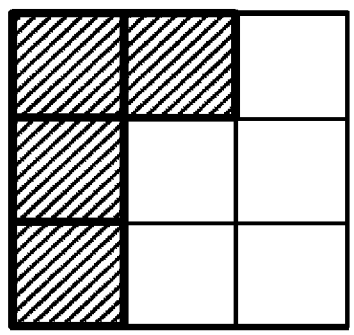
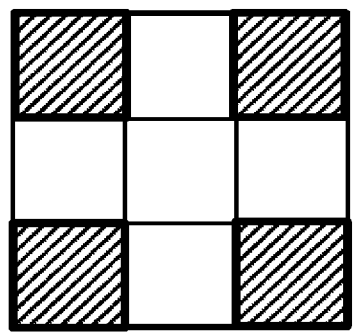
FIG.14A  FIG.14B
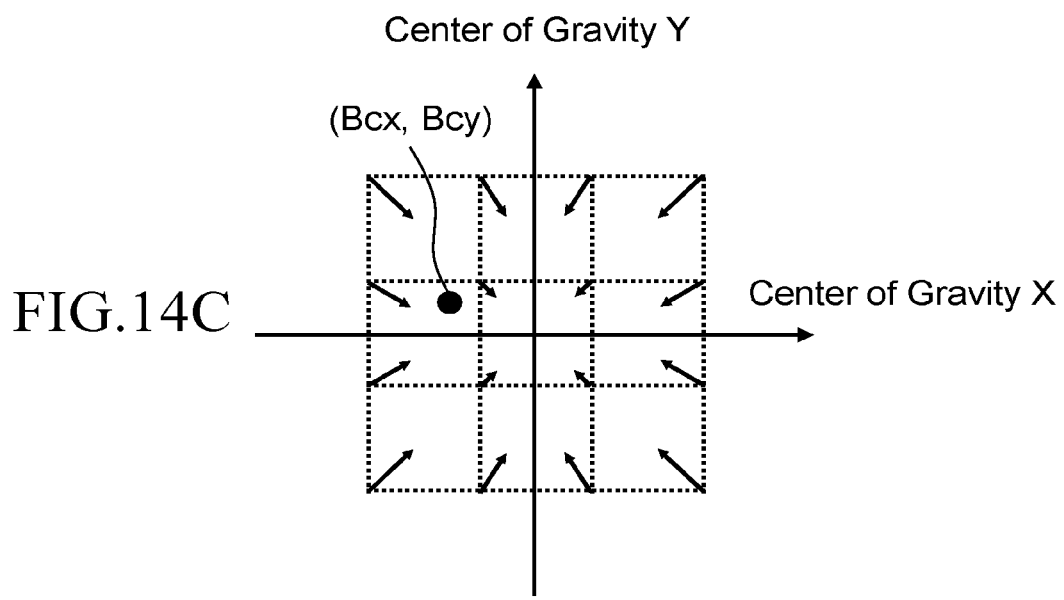
FIG.14C

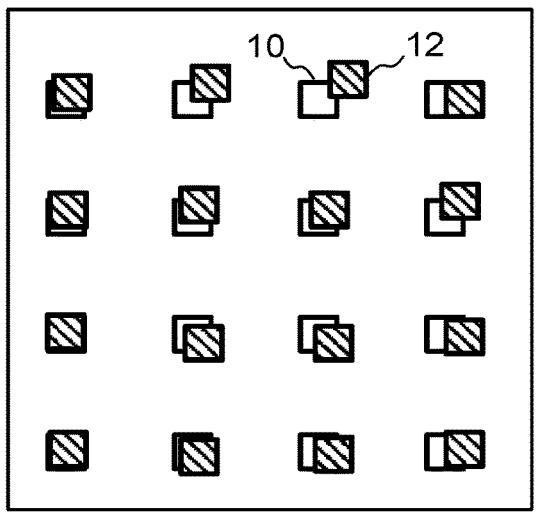 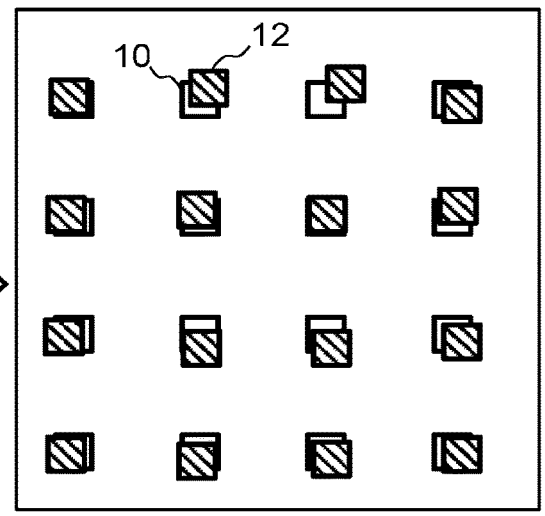
Deviated with
different change amount
FIG.15A
Deviated with
different change amount,
and then,
corrected by collective deflection
FIG.15B

MULTI-CHARGED PARTICLE BEAM WRITING APPARATUS AND MULTI-CHARGED PARTICLE BEAM WRITING METHOD

CROSS-REFERENCE TO RELATED APPLICATION

This application is based upon and claims the benefit of priority from prior Japanese Patent Application No. 2020-025337 filed on Feb. 18, 2020 in Japan, the entire contents of which are incorporated herein by reference.

BACKGROUND OF THE INVENTION

Field of the Invention

Embodiments of the present invention relate to a multi-charged particle beam writing apparatus and a multi-charged particle beam writing method, and, for example, to a method for correcting a positional deviation (shift) of a beam array occurring on the substrate surface of the multi-beam writing apparatus.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In multi-beam writing, the dose of each beam is individually controlled based on an irradiation time. For highly accurately controlling the dose of each beam, blanking control to provide an ON or OFF condition of each beam should be carried out at high speed. In a writing apparatus of the multi-beam system, a blanking control circuit for each beam is placed in the blanking aperture array mechanism where a blanker for each of multiple beams is arranged.

In the blanking aperture array mechanism, since wiring of electrodes configuring each blanker and control circuits are close to each beam, a magnetic field generated by the current flowing in these wiring and control circuits may affect the trajectory of beams. Thereby, positional deviation of each beam occurs on the substrate surface. As other factors affecting the trajectory of beams, there are a Coulomb effect, electrification, and the like (e.g., refer to Japanese patent Application Laid-Open (JP-A) No. 5-166707). As a method for correcting positional deviation of multiple beams, there may be a method of calculating an average positional deviation amount of beams in advance, and feeding it back to writing, for example. However, with respect to these factors of positional deviation, since the change amount varies for every shot (changing shot by shot), it is difficult to perform correction for each shot by using the method described above.

BRIEF SUMMARY OF THE INVENTION

According to one aspect of the present invention, a multi-charged particle beam writing apparatus includes a stage configured to be movable and to mount a substrate thereon, a shot data generation circuit configured to generate shot data of each shot of multiple charged particle beams, a shift amount calculation circuit configured to calculate a shift amount for collectively correcting positions of all of the multiple charged particle beams of a k-th shot, based on a parameter related to at least (k+1)th and subsequent shots (k being a natural number) of the multiple charged particle beams, and a writing mechanism including a deflector for deflecting the multiple charged particle beams, and the writing mechanism configured to perform the k-th shot onto the substrate with the multiple charged particle beams while shifting the all of the multiple charged particle beams of the k-th shot by collective deflection according to the shift amount.

According to another aspect of the present invention, a multi-charged particle beam writing apparatus includes a stage configured to be movable and to mount a substrate thereon, a shot data generation circuit configured to generate shot data of each shot of multiple charged particle beams, a shift amount calculation circuit configured to calculate a shift amount for collectively correcting positions of all of the multiple charged particle beams of a k-th shot, based on a parameter related to at least (k−1)th and previous shots (k being a natural number) of the multiple charged particle beams, and a writing mechanism including a deflector for deflecting the multiple charged particle beams, and the writing mechanism configured to perform the k-th shot onto the substrate with the multiple charged particle beams while shifting the all of the multiple charged particle beams of the k-th shot by collective deflection according to the shift amount.

According to yet another aspect of the present invention, a multi-charged particle beam writing method includes generating shot data of each shot of multiple charged particle beams, calculating a shift amount for collectively correcting positions of all of the multiple charged particle beams of a k-th shot, based on a parameter related to at least (k+1)th and subsequent shots (k being a natural number) of the multiple charged particle beams, and performing the k-th shot onto a substrate placed on a movable stage with the multiple charged particle beams while shifting the all of the multiple charged particle beams of the k-th shot by collective deflection according to the shift amount.

BRIEF DESCRIPTION OF THE DRAWINGS

FIG. 8 shows an example of a relation of a cause of beam position deviation (shift), a related parameter, and a correction amount according to the first embodiment;

FIGS. 14A to 14C illustrate other examples of the position of the center of gravity of an ON-beam according to the first embodiment; and FIGS. 15A and 15B show an example of shifting of multiple beams according to the first embodiment.

DETAILED DESCRIPTION OF THE INVENTION

Embodiments below describe a multi-charged particle beam writing apparatus and method that can reduce each beam's positional deviation (shift) amount whose change amount varies for each shot in multi-beam writing.

Embodiments below describe a configuration in which an electron beam is used as an example of a charged particle beam. The charged particle beam is not limited to the electron beam, and other charged particle beam such as an ion beam may also be used.

First Embodiment

Figure 1:
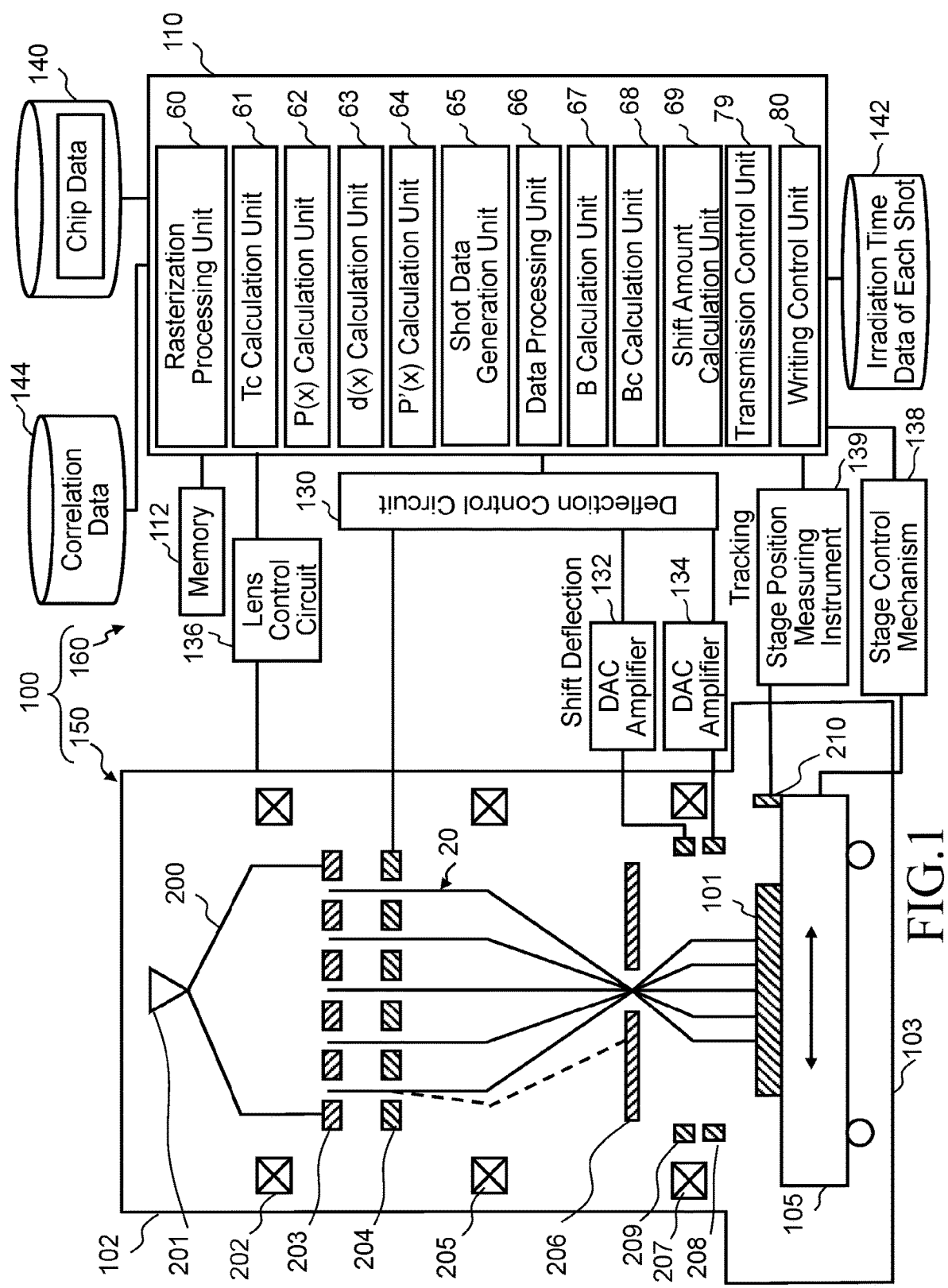
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi-charged particle beam writing apparatus, and a multi-charged particle beam exposure apparatus. The writing mechanism 150 includes an electron optical column 102 (electron beam column) and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, a main deflector 208, and a sub deflector 209. In the writing chamber 103, an XY stage 105 is disposed. On the XY stage 105, there is placed a target object or "sample" 101 such as a mask serving as a writing target substrate when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, a mirror 210 for measuring the position of the XY stage 105 is placed.

The control system circuit 160 includes a control computer 110, a memory 112, a deflection control circuit 130, DAC (digital-analog converter) amplifier units 132 and 134, a lens control circuit 136, a stage control mechanism 138, a stage position measuring instrument 139, and storage devices 140, 142, and 144 such as magnetic disk drives. The control computer 110, the memory 112, the deflection control circuit 130, the lens control circuit 136, the stage control mechanism 138, the stage position measuring instrument 139, and the storage devices 140, 142, and 144 are connected to each other through a bus (not shown). The DAC amplifier units 132 and 134 and the blanking aperture array mechanism 204 are connected to the deflection control circuit 130. The sub deflector 209 is composed of at least four electrodes (or "at least four poles"), and controlled by the deflection control circuit 130 through the DAC amplifier unit 132 disposed for each electrode. The main deflector 208 is composed of at least four electrodes (or "at least four poles"), and controlled by the deflection control circuit 130 through the DAC amplifier unit 134 disposed for each electrode. Based on the principle of laser interferometry, the stage position measuring instrument 139 measures the position of the XY stage 105 by receiving a reflected light from the mirror 210.

In the control computer 110, there are arranged a rasterization processing unit 60, a shot cycle Tc calculation unit 61, a pattern density P(x) calculation unit 62, a correction irradiation coefficient d(x) calculation unit 63, a dose density P'(x) calculation unit 64, a shot data generation unit 65, a data processing unit 66, an ON-beam amount B calculation unit 67, a Bc (center of gravity) calculation unit 68, a shift amount calculation unit 69, a transmission control unit 79, and a writing control unit 80. Each of the " . . . units" such as the rasterization processing unit 60, the shot cycle calculation unit 61, the pattern density calculation unit 62, the correction irradiation coefficient calculation unit 63, the dose density calculation unit 64, the shot data generation unit 65, the data processing unit 66, the ON-beam amount calculation unit 67, the center-of-gravity calculation unit 68, the shift amount calculation unit 69, the transmission control unit 79, and the writing control unit 80 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the rasterization processing unit 60, the shot cycle calculation unit 61, the pattern density calculation unit 62, the correction irradiation coefficient calculation unit 63, the dose density calculation unit 64, the shot data generation unit 65, the data processing unit 66, the ON-beam amount calculation unit 67, the center-of-gravity calculation unit 68, the shift amount calculation unit 69, the transmission control unit 79, and the writing control unit 80, and information being operated are stored in the memory 112 each time.

Writing operations of the writing apparatus 100 are controlled by the writing control unit 80. The processing of transmitting irradiation time data of each shot to the deflection control circuit 130 is controlled by the transmission control unit 79.

Chip data (writing data) is input from the outside of the writing apparatus 100, and stored in the storage device 140. The chip data defines information on a plurality of figure patterns which configure a chip to be written. Specifically, for example, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
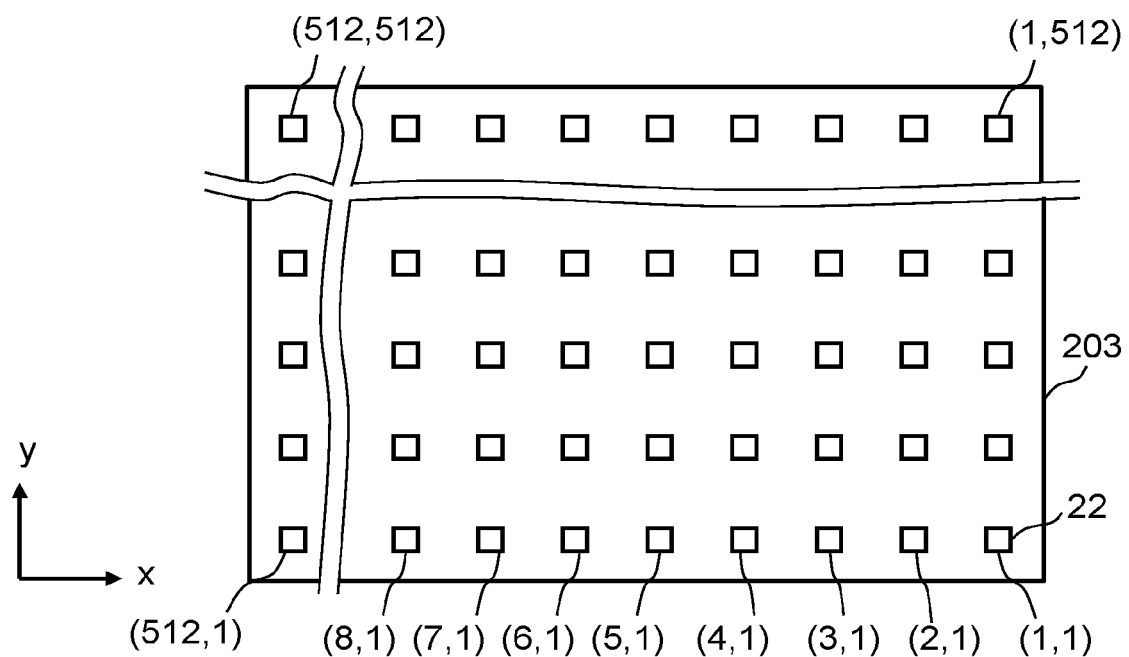
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. The number of holes 22 is not limited thereto. For example, it is also preferable to form the holes 22 of 32×32. Each of the holes 22 is rectangular, including square, having the same dimension and shape as each other. Alternatively, each of the holes 22 may be a circle with the same diameter as each other. Multiple beams 20 are formed by letting portions of an electron beam 200 individually pass through a corresponding one of a plurality of holes 22. In other words, the shaping aperture array substrate 203 forms multiple beams 20.

Figure 3:
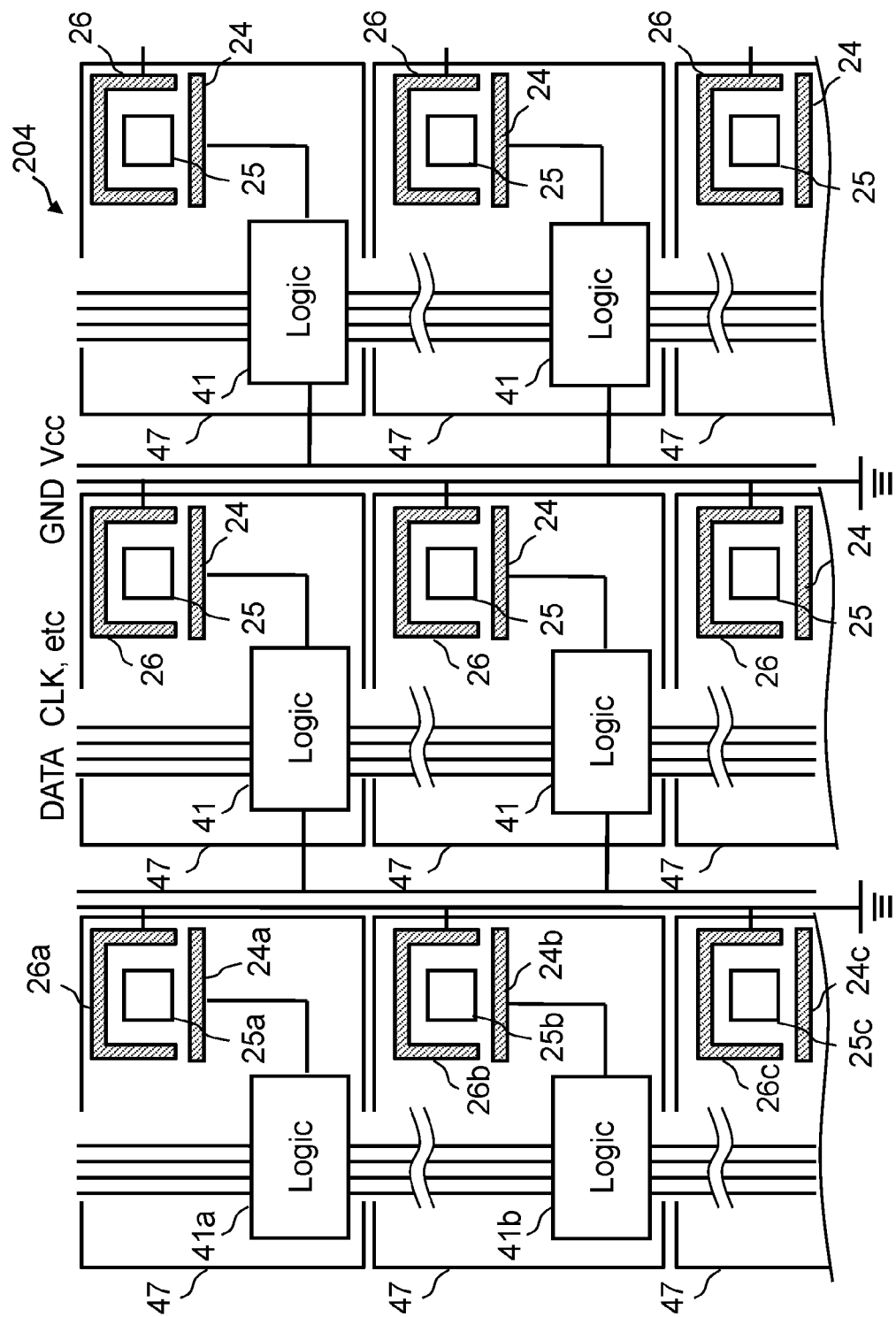
FIG. 3 is a top view conceptual diagram showing a portion of the structure in a membrane region of a blanking aperture array mechanism according to the first embodiment.

FIG. 3 is a top view conceptual diagram showing a portion of the structure in a membrane region of a blanking aperture array mechanism according to the first embodiment. In the blanking aperture array mechanism 204, in the membrane region with thinned central part of the substrate, passage holes 25 (openings) through each of which a corresponding one of multiple beams passes are formed at positions each corresponding to each hole 22 in the shaping aperture array substrate 203 shown in FIG. 2. A pair (blanker: blanking deflector) of a control electrode 24 and a counter electrode 26 is arranged in a manner such that the electrodes 24 and 26 are opposite to each other across a corresponding one of the plurality of the passage holes 25. Close to each passage hole 25 and inside the blanking aperture array substrate 31, there is arranged a control circuit 41 (logic circuit; cell) which applies a deflection voltage to the control electrode 24 for the passage hole 25 concerned. The counter electrode 26 for each beam is grounded.

Figure 4:
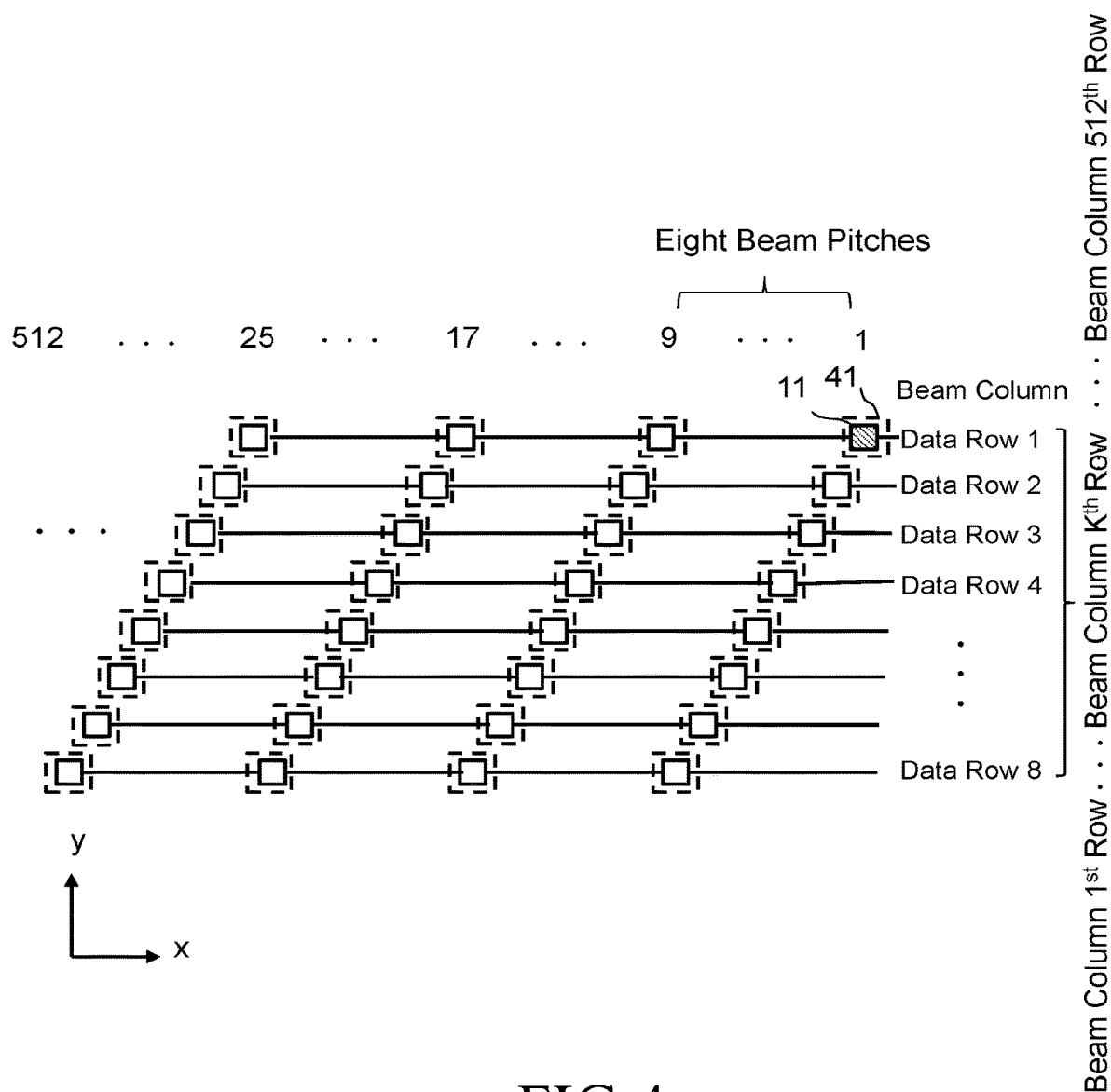
FIG. 4 shows an example of a connected configuration of shift registers according to the first embodiment.

As shown in FIG. 3, n-bit parallel lines for control signals are connected to each control circuit 41. In addition to the n-bit parallel lines for irradiation time control signals (data), lines for a clock (shift clock) signal, a load signal, a shot signal, a power supply and the like are connected to each control circuit 41. Alternatively, a part of the parallel lines may be used as the lines described above. An individual blanking mechanism 47 composed of the control electrode 24, the counter electrode 26, and the control circuit 41 is configured for each beam of multiple beams. As a data transmission system, the first embodiment employs the shift register system, where multiple beams are divided into a plurality of groups each composed of a plurality of beams, and a plurality of shift registers for a plurality of beams in the same group are connected in series. Specifically, a plurality of control circuits 41 formed in an array are grouped by a predetermined pitch in the same row or the same column, for example. The control circuits 41 in the same group are connected in series as shown in FIG. 4. A signal for each shot is transmitted to the control circuit 41 in the group.

FIG. 4 shows an example of a connected configuration of shift registers according to the first embodiment. The control circuit 41 for each beam is formed in an array at the central part of the substrate of the blanking aperture array mechanism 204. For example, a plurality of control circuits 41 (arranged in the x direction) in the same row are grouped. In the case of FIG. 4, the control circuits 41 in each row are distributed in order into eight groups to be grouped. For example, in the case of multiple beams of 512 rows×512 columns, the control circuits 41 for the 1st to 512th beams in each row are grouped. Specifically, the control circuits 41 for the 1st, 9th, 17th, 25th beams and so on at every eighth beam pitch in the 1st to 512th beams configure a data row 1 (group). Similarly, the control circuits 41 for the 2nd, 10th, 18th, 26th beams and so on at every eighth beam pitch configure a data row 2 (group). In this way, a data row 3 (group) to a data row 8 (group) are configured. Then, the control circuits 41 in each group are connected in series. A signal for each row output from the deflection control circuit 130 to the blanking aperture array mechanism 204 is divided through an I/O circuit (not shown) and transmitted in parallel to each group. The signal for each group is transmitted to the control circuits 41 connected in series in the group concerned. Specifically, a shift register 11 is disposed in each control circuit 41, and shift registers 11 in the control circuits 41 in the same group are connected in series. In the case of FIG. 4, sixty-four shift registers 11 are connected in series in each data row (group), for example. Therefore, when n-bit data is transmitted in series, by clock signals of the number of times being n multiplied by sixty-four, irradiation time control signal (ON/OFF control data) for each beam is transferred (transmitted) to each control circuit 41 in the blanking aperture array mechanism 204 through the shift register 11 for each beam.

Based on an irradiation time control signal transmitted to the shift register 11 for each beam, each individual blanking mechanism 47 individually controls, for each beam, the irradiation time of the shot concerned using a counter circuit (not shown). Alternatively, a maximum irradiation time T max for one shot is divided into several sub-shots having different irradiation time. Then, based on the irradiation time control signal transmitted to the shift register 11 for each beam, each blanking mechanism 47 selects a combination of sub-shots from a plurality of sub-shots in order that the combination may become the irradiation time for one shot. It is also preferable to control the irradiation time for one shot for each beam by continuously applying irradiation to pixels whose combinations of selected sub-shots are the same as each other. It will be described based on the case that the irradiation time of the shot concerned is individually controlled for each beam by using a counter circuit.

Figure 5:
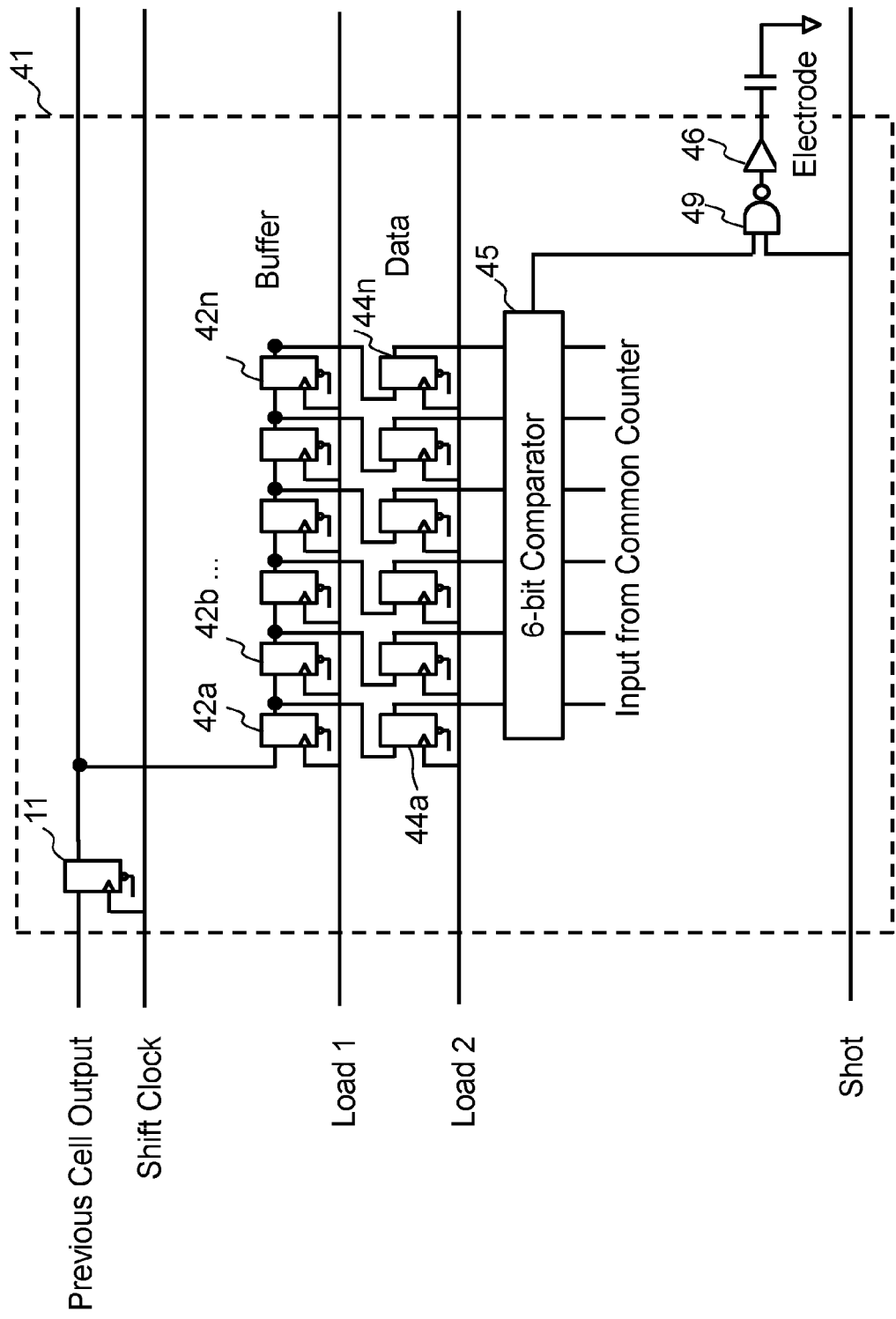
FIG. 5 shows an example of a control circuit for an individual beam disposed in a blanking aperture array mechanism according to the first embodiment.

FIG. 5 shows an example of a control circuit for an individual beam disposed in a blanking aperture array mechanism according to the first embodiment. In FIG. 5, in each control circuit 41, there are disposed the shift register 11, a plurality of registers 42 of n bits used as a buffer, a plurality of registers 44 of n bits for execution, a comparator 45, an amplifier 46, and an AND circuit 49. FIG. 5 shows the case where an irradiation time control signal is defined by six bits, for example. As the irradiation time control signal, a counter value Tr equivalent to an irradiation time is defined. In FIG. 5, outputs of the shift register 11 are connected to the input of the next shift register 11 in the same group, and the input of the first register 42a in the own control circuit 41. A plurality of registers 42(a to n) are connected in series. Outputs of each of the plurality of registers 42(a to n) are connected to the input of a next register 42, and the input of a corresponding register 44. A plurality of registers 44(a to n) are connected in series. Outputs of each register 44 are connected to the input of the comparator 45. Outputs from a common counter circuit (not shown) are connected to the comparator 45. Outputs of the comparator 45 are connected to the input of the AND circuit 49. Further, shot signals transmitted from the deflection control circuit 130 are connected to the input of the AND circuit 49. Outputs of the AND circuit 49 are connected to the input of the amplifier 46. Outputs of the amplifier 46 are connected to the control electrode 24.

In FIG. 5, the first bit signal of an irradiation time control signal (data) of each beam of the k-th shot is stored in a desired shift register 11 by being transmitted synchronized with shift clock signals transmitted from the deflection control circuit 130, where the number of the shift clock signals is the same as that of a plurality of shift registers 11 connected in series in the same group. Since the irradiation time control signal (data) is a binary control signal, it is an H signal or an L signal. The irradiation time control signal (data) of the first bit stored in the shift register 11 is read and stored in the first register 42 in synchronization with a load 1 signal transmitted from the deflection control circuit 130. In the case of n-bit data, by n times performing the same operation described above, the n-bit data are divided and stored in a plurality of registers 42 as the irradiation time control signal (data) of each beam of the k-th shot. The irradiation time control signals (data) stored in the plurality of registers 42 are read and stored in a plurality of registers 43 in synchronization with a load 2 signal transmitted from the deflection control circuit 130. Thereby, the n-bit data are divided and stored in the plurality of registers 43. Accordingly, the n-bit data having been divided and stored in the plurality of registers 43 are input to the comparator 45. Then, H signals are output to the input of the AND circuit 49 until the number of times tc, which is counted in a predetermined cycle (irradiation time resolution) by a common counter circuit (not shown), reaches the counter value Tr having been input to the comparator 45. In other words, H signals are output from the comparator 45 to the input of the AND circuit 49 only during a period of Tr>tc. With respect to the input of the AND circuit 49, when the signal from the comparator 45 is a "beam ON" signal, H signals are input only during the ON period, and in other case, L signals are input. Meanwhile, only during inputting shot signals (H signal) transmitted from the deflection control circuit 130, the AND circuit 49 outputs a "beam ON" signal (H) to the amplifier 46 as long as the signal from the comparator 45 is an H signal. In other case, the AND circuit 49 outputs a "beam OFF" signal (L) to the amplifier 46. The amplifier 46 applies a beam ON potential (GND) to the control electrode 24 only while "beam ON" signals (H) are output from the AND circuit 49. In other case, the amplifier 46 applies a beam OFF potential (Vdd) to the control electrode 24. Each beam is deflected by an electric potential difference between the potential applied to the control electrode 24 and the ground potential applied to the counter electrode 26, and is controlled to be "beam OFF" by being blocked by the limiting aperture substrate 206. If the potential applied to the control electrode 24 and the ground potential applied to the counter electrode 26 are equipotential, each beam passes through a hole in the center without being blocked by the limiting aperture substrate 206, and is controlled to be "beam ON". By synchronizing a counting start of the counter circuit with a shot signal, the k-th shot of a desired irradiation time can be executed. Next shot data is sequentially transmitted to each register. After the k-th shot is completed, when the AND circuit 49 inputs a next shot signal (H signal), the (k+1)th shot is to be executed. Henceforth, each shot is carried out in order.

Figure 6:
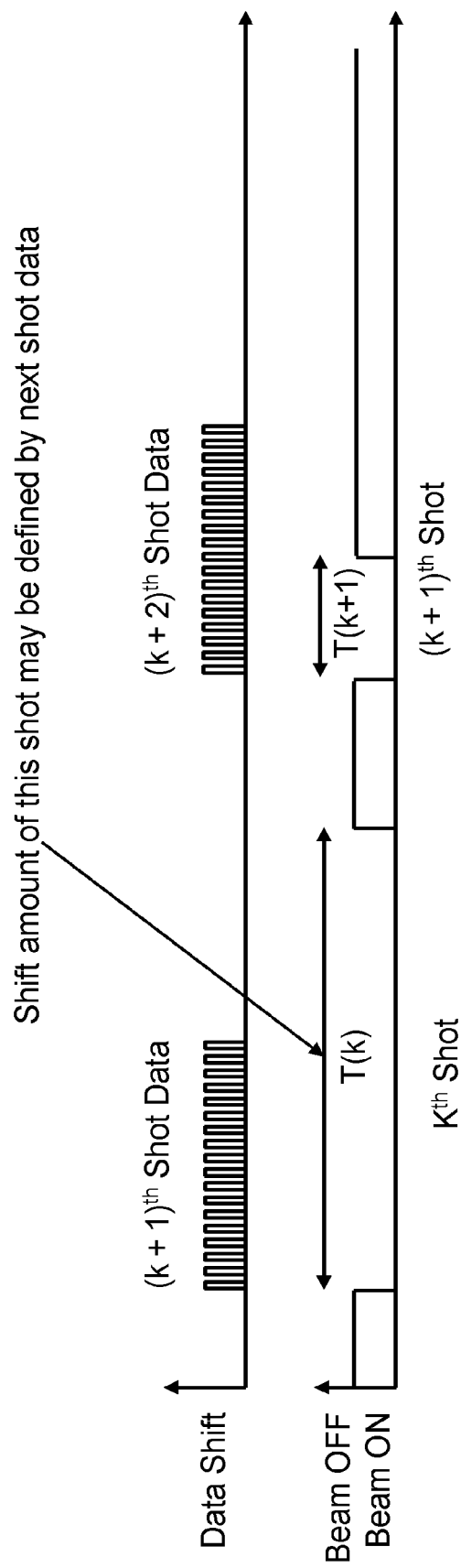
FIG. 6 shows an example of a timing chart of data transmission and a shot in a blanking aperture array mechanism according to the first embodiment.

FIG. 6 shows an example of a timing chart of data transmission and a shot in a blanking aperture array mechanism according to the first embodiment. As shown in FIG. 6, during the k-th shot, an irradiation time control signal (data) of the (k+1)th shot is transmitted to each shift register 11 and stored in a plurality of registers 42 in each control circuit 41, by the same procedure described above. Therefore, during the k-th shot, a current resulting from the (k+1)th shot data flows inside each control circuit 41. As described above, in the blanking aperture array mechanism 204, since wiring of the control electrode 24 and the counter electrode 26 configuring each blanker and the control circuit 41 are close to each beam, a magnetic field generated by the current flowing in these wiring and the control circuit 41 may affect the trajectory of beams. Deviation may occur in the beam trajectory, especially of the k-th shot, by the magnetic field resulting from the (k+1)th shot data. If a buffer circuit for one shot, such as a plurality of registers 42, is further added superfluously, deviation may occur in the beam trajectory of the k-th shot by the magnetic field resulting from the (k+2)th shot data. In other words, deviation may occur in the beam trajectory by a magnetic field resulting from shot data of a future shot.

Figure 7:
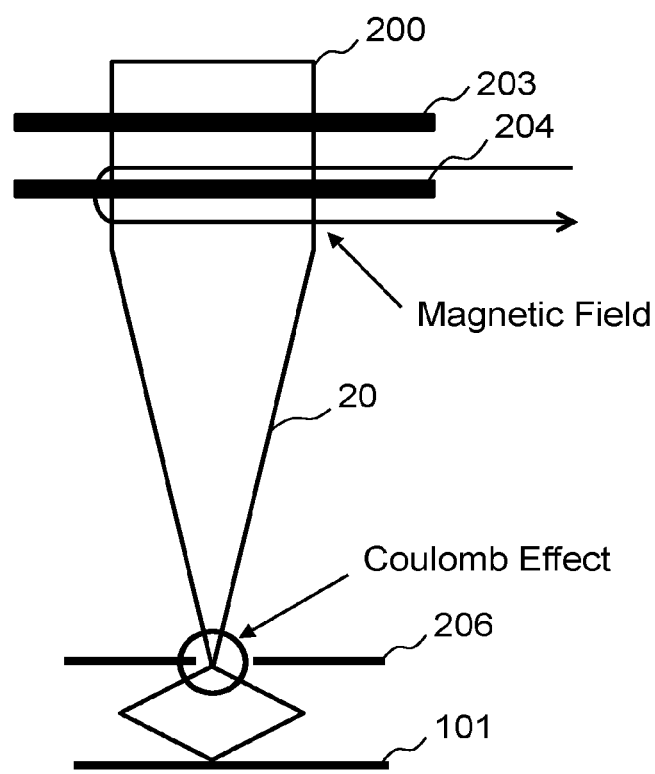
FIG. 7 illustrates trajectory change of multiple beams according to the first embodiment.

FIG. 7 illustrates trajectory change of multiple beams according to the first embodiment. As shown in FIG. 7, beam positional deviation and/or beam defocusing may be generated by the Coulomb effect occurring in the multiple beams 20 other than by the magnetic field in the blanking aperture array mechanism 204. The Coulomb effect in the k-th shot acts depending on the current amount of the multiple beams 20 of the k-th shot. The current amount of the multiple beams 20 of the k-th shot can be recognized (known) from the shot data of the k-th shot. In other words, deviation in the beam trajectory of each shot may be generated by the Coulomb effect resulting from shot data of the shot concerned.

Further, charging of an objective deflector, such as the main deflector 208 and the sub deflector 209 which deflect the multiple beams 20, also affects the beam trajectory when the multiple beams 20 are deflected. Charging of the objective deflector at the k-th shot occurs by the multiple beams 20 of the (k−1)th and previous shots. The charge amount of the objective deflector can be recognized (known) from the shot data of the (k−1)th and previous shots. If charging time decay is a little, the (k−m)th (m>1) and previous shots, where the number of shots increases accordingly, affect the k-th shot. In other words, deviation in the beam trajectory of each shot may occur by the charging of the objective deflector resulting from shot data of past shots.

Then, according to the first embodiment, the amount of positional deviation of the multiple beams 20 by the magnetic field generated in the blanking aperture array mechanism 204 with respect to the k-th shot is defined using parameters related to the (k+1)th and subsequent shots. Similarly, the amount of positional deviation of the multiple beams 20 by the Coulomb effect on the k-th shot is defined using a parameter related to the k-th shot. Similarly, the amount of positional deviation of the multiple beams 20 by the charging of the objective deflector with respect to the k-th shot is defined using parameters related to the (k−1)th and previous shots.

FIG. 8 shows an example of a relation of a cause of beam position deviation (shift), a related parameter, and a correction amount according to the first embodiment. In FIG. 8, as a place where a beam trajectory deviation (shift) occurs due to charging of a deflector, there is cited an objective deflector. Then, as a parameter associated with charging of the objective deflector, a pattern density or a dose density is cited. Therefore, if a correlation between a pattern density or dose density and a beam array shift amount of the multiple beams 20 can be acquired, it is possible to perform correction. Also, in FIG. 8, as a place where a beam trajectory deviation occurs due to the Coulomb effect, a crossover position closer to the surface of the target object can be cited as shown in FIG. 7. When a total current value of ON-beams becomes large, a beam positional deviation on the target object surface and/or focus deviation occurs due to a Coulomb force. As a parameter associated with the Coulomb effect, a distribution of ON-beams for each sub-shot is cited regarding the shot dividing system. Therefore, if a correlation with respect to an ON-beam total dose (ON-beam amount), a center of gravity of distribution, and a beam array shift amount of the multiple beams 20 can be acquired, it is possible to perform correction. As a parameter associated with the Coulomb effect, a dose distribution for each shot is cited regarding the counter system. Therefore, if a correlation with respect to an ON-beam total dose (ON-beam amount) of the multiple beams 20, a center of gravity of distribution, and a beam array shift amount of the multiple beams 20 can be acquired, it is possible to perform correction. Also in FIG. 8, as a place where a beam trajectory deviation occurs due to a blanking operation, there is cited a place close to the blanking aperture array mechanism 204. Then, as a parameter associated with a current amount being a base of the magnetic field in the blanking aperture array mechanism 204, there is cited a shot cycle and an ON-beam total amount (ON-beam amount). Therefore, if a correlation between a shot cycle and a beam array shift amount of the multiple beams 20, and a correlation between an ON-beam amount at a fixed shot cycle and a beam array shift amount of the multiple beams 20 can be acquired, it is possible to perform correction.

Figure 9:
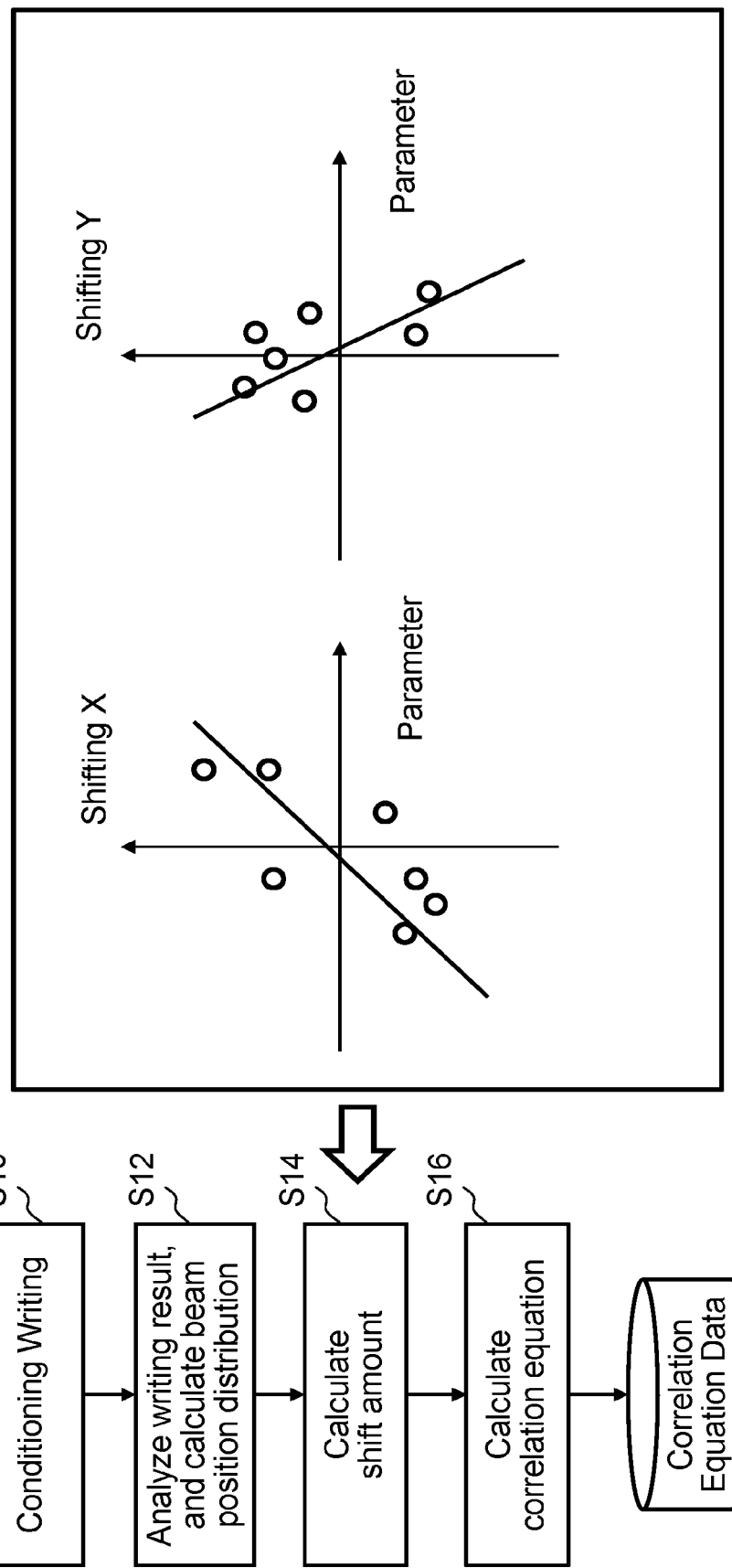
FIG. 9 is a flowchart showing an example of a method for obtaining a correlation between a parameter and a shift amount according to the first embodiment.

FIG. 9 is a flowchart showing an example of a method for obtaining a correlation between a parameter and a shift amount according to the first embodiment. In FIG. 9, the method for obtaining a correlation between a parameter and a shift amount of the first embodiment executes a series of steps: a condition change writing step (S10), a writing result analysis and beam position distribution calculation step (S12), a shift amount calculation step (S14), and a correlation equation calculation step (S16).

In the condition change writing step (S10), while changing the value of each of a plurality of parameters, the writing apparatus 100 emits (applies), with respect to each parameter, the multiple beams 20 to measure the position of each beam of the multiple beams 20, using a position detection mark (not shown) on the XY stage 105. Alternatively, it is also preferable to write an evaluation pattern on an evaluation substrate with the multiple beams 20. The parameter used as that associated with charging of the objective deflector with respect to the k-th shot is a pattern density P or a dose density P' at the irradiation positions of the multiple beams used in the (k−1)th and previous shots. The parameter used as that associated with the Coulomb effect with respect to the k-th shot is a combination of an ON-beam amount B and a center of gravity (Bcx, Bcy) of distribution of the multiple beams 20 used in the k-th shot. The parameter used as that associated with a current amount being a base of the magnetic field in the blanking aperture array mechanism 204 for the k-th shot is a combination of a shot cycle Tc and an ON-beam amount B of the multiple beams 20 used in the (k+1)th and subsequent shots.

In the writing result analysis and beam position distribution calculation step (S12), for each parameter, a beam position distribution is calculated by analyzing the measured position of each beam. Alternatively, after taking the written evaluation substrate out to be developed, the irradiation position of each beam is measured for each parameter kind and each parameter value by another position measuring instrument to generate a beam position distribution.

In the shift amount calculation step (S14), for each parameter kind and each parameter value, calculated is a shift amount (correction amount) for making each acquired beam position distribution be close to a design position as much as possible. Here, a shift amount for collectively shifting (position correction) all the multiple beams 20 is calculated. For example, a shift amount at the time of alignment is calculated by the method of least squares. The shift amount is obtained with respect to each of the x and y directions.

In the correlation equation calculation step (S16), a correlation equation is calculated by fitting a shift amount obtained for each parameter (or a combination of parameters). For example, calculated are correlation equations $Gx(P)$ and $Gy(P)$ for obtaining shift amounts in the x and y directions to correct a positional deviation amount of the k-th shot resulting from charging of the objective deflector, depending on the pattern density P at the irradiation positions of the multiple beams used in the (k−1)th and previous shots. Alternatively, for example, calculated are correlation equations $Gx(P')$ and $Gy(P')$ for obtaining shift amounts in the x and y directions to correct a positional deviation amount of the k-th shot resulting from charging of the objective deflector, depending on the dose density P' at the irradiation positions of the multiple beams used in the (k−1)th and previous shots. With respect to past shots, it is preferable to use parameters related to the (k−1)th to the (k−m)th shots, depending on a charge decay period. Moreover, for example, calculated are correlation equations $Cx(B, Bcx, Bcy)$ and $Cy(B, Bcx, Bcy)$ for obtaining shift amounts in the x and y directions to correct a positional deviation amount of the k-th shot resulting from the Coulomb effect, depending on a combination of an ON-beam amount B and a center of gravity (Bcx, Bcy) of distribution of the multiple beams 20 used in the k-th shot. Moreover, for example, calculated are correlation equations $Mx(Tc, B)$ and $My(Tc, B)$ for obtaining shift amounts in the x and y directions to correct a positional deviation amount of the k-th shot resulting from the magnetic field in the blanking aperture array mechanism 204, depending on a combination of a shot cycle Tc and an ON-beam amount B of the multiple beams 20 used in the (k+1)th and subsequent shots. With respect to future shots, it is preferable to use parameters related to the (k+1)th to (k+j)th shots, according to the number of shots to be data transmitted in the blanking aperture array mechanism 204 at the k-th shot. Data of each acquired correlation equation is input to the writing apparatus 100, and stored in the storage device 144.

Figure 10:
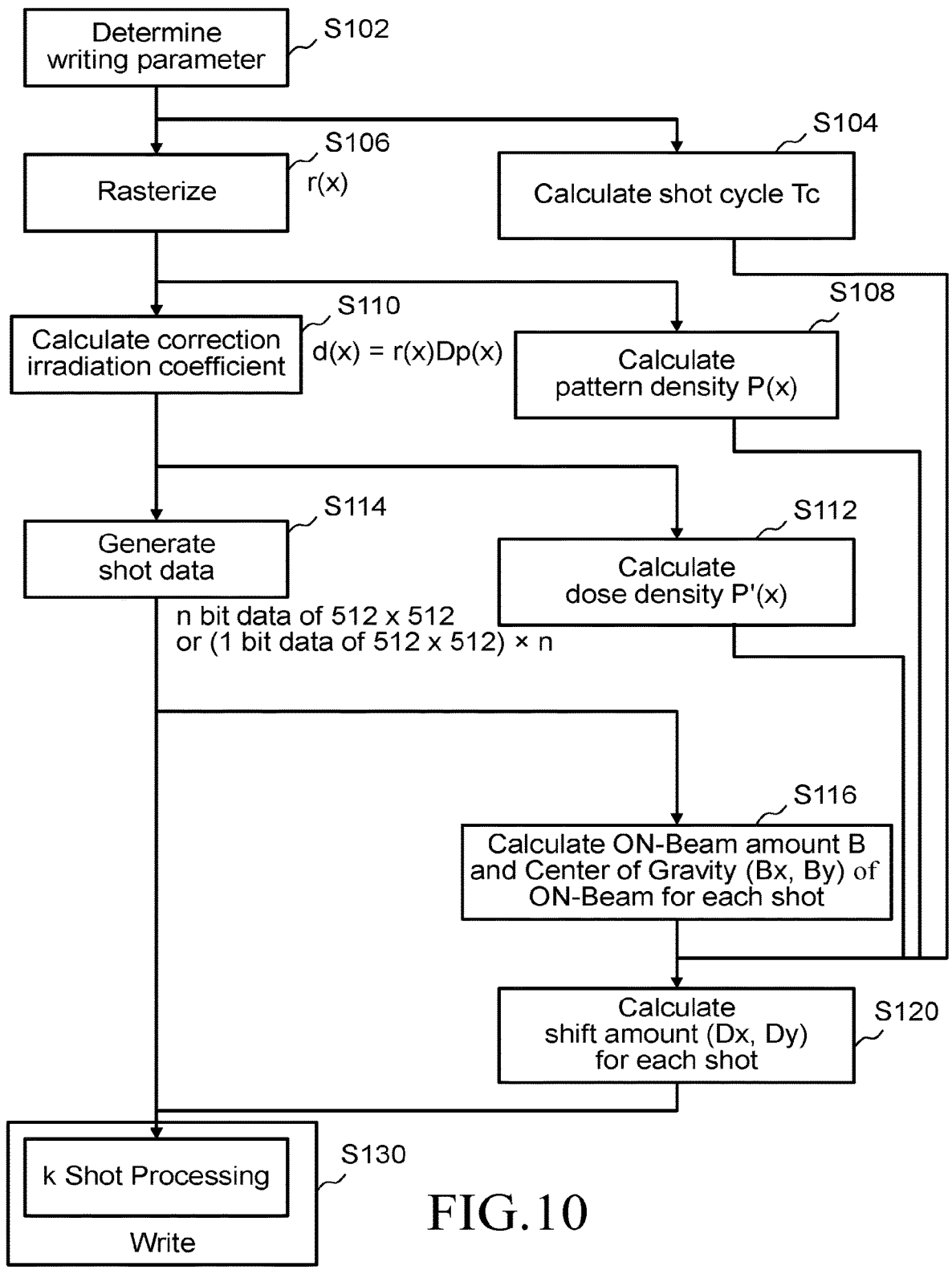
FIG. 10 is a flowchart showing an example of main steps of a writing method according to the first embodiment.

FIG. 10 is a flowchart showing an example of main steps of a writing method according to the first embodiment. In FIG. 10, the writing method of the first embodiment executes a series of steps: a writing parameter determination step (S102), a shot cycle calculation step (S104), a rasterizing step (S106), a pattern density calculation step (S108), a correction irradiation coefficient calculation step (S110), a dose density calculation step (S112), a shot data generation step (S114), an ON-beam amount and center-of-gravity of ON-beam calculation step (S116) for each shot, a shift amount calculation step (S120) for each shot, and a writing step (S130).

In the writing parameter determination step (S102), information on writing parameters is input to the writing apparatus 100, and stored in the storage device 140. Alternatively, it is also preferable that the user selects a combination of writing parameters to be used in writing processing for the chip concerned from a combination of a plurality of writing parameters prepared in advance, using an interface (not shown) such as GUI (graphic user interface). Thereby, the writing parameters to be used in writing processing for the chip concerned is determined. As an example of the writing parameter, there is a base dose Db, a dose modulation amount Dp(x) for correcting a proximity effect, and the like.

In the shot cycle calculation step (S104), the shot cycle Tc calculation unit 61 calculates a shot cycle Tc to be used in writing processing for the chip concerned, using a determined writing parameter. If the base dose Db and the dose modulation amount Dp(x) are set (determined), the shot cycle Tc can be obtained. Specifically, a maximum dose D max can be obtained by multiplying the base dose Db by the dose modulation amount Dp(x). Therefore, a maximum irradiation time T max can be acquired by dividing the maximum dose D max by a current density J. The shot cycle Tc is preferably set to be the acquired maximum irradiation time T max or a value obtained by adding a settling time of the sub deflector 209 to the maximum irradiation time T max, for example. Although the dose modulation amount Dp(x) is here calculated offline, it may be acquired in the writing apparatus 100.

In the rasterizing step (S106), the rasterization processing unit 60 reads chip data (writing data) from the storage device 140, and performs rasterization processing. Specifically, the rasterization processing unit 60 calculates, for each pixel, an area density p(x) of the pattern in the pixel concerned. Here, first, the writing region on the target object 101 is described below.

Figure 11:
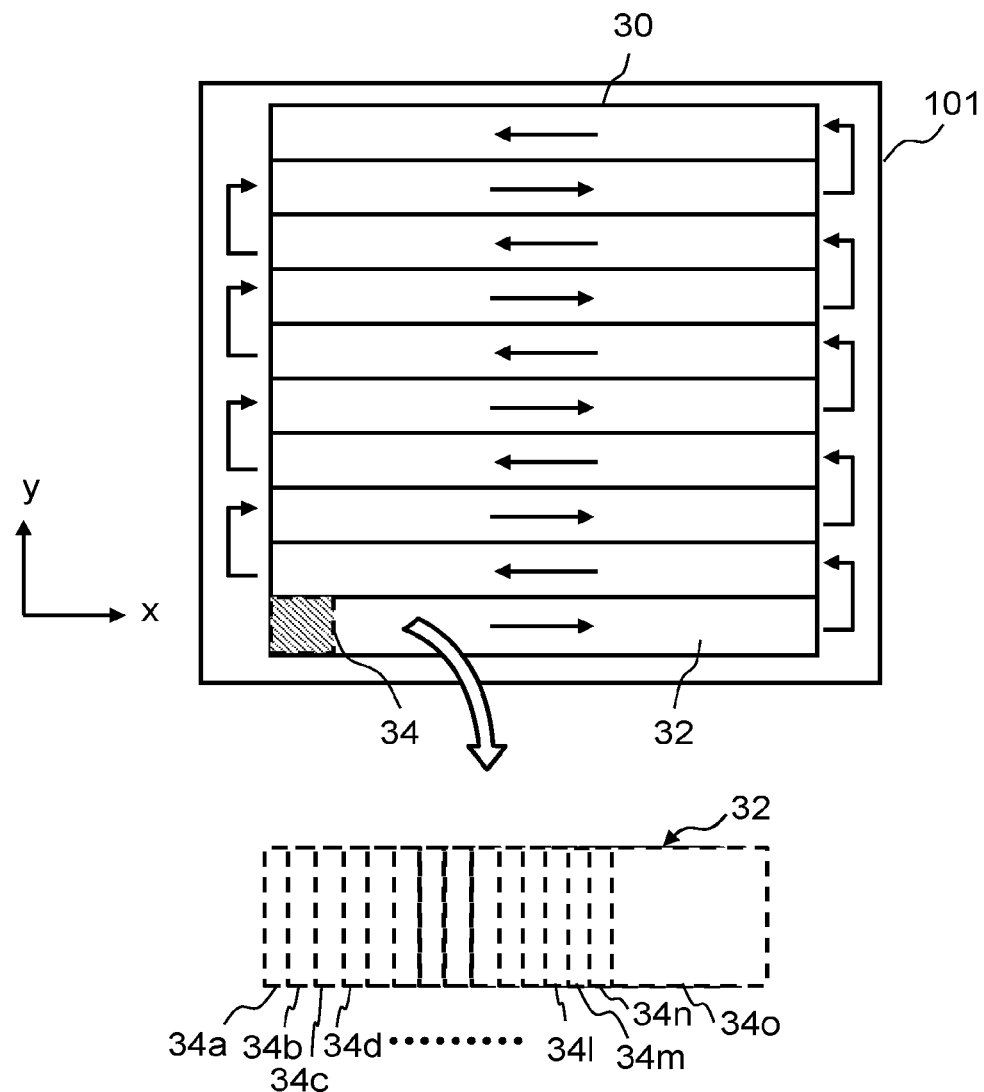
FIG. 11 is a conceptual diagram illustrating an example of a region to be written according to the first embodiment.

FIG. 11 is a conceptual diagram illustrating an example of a region to be written according to the first embodiment. As shown in FIG. 11, a writing region 30 of the target object 101 is virtually divided, for example, by a predetermined width/length in the y direction, into a plurality of stripe regions 32 in a strip form. The writing region 30 is equivalent to a chip region defined by chip data. When the writing apparatus 100 writes a pattern in the writing region 30, for example, first, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction so that the writing may relatively proceed in the x direction. The XY stage 105 is moved, for example, continuously at a constant speed. After writing the first stripe region 32, the stage position is moved in the −y direction, and then, writing is performed in the −x direction by moving the XY stage 105 in the x direction, for example. By repeating such operations, each stripe region 32 is written in order. That is, by performing writing while alternately changing the direction, the writing time can be reduced. However, the writing operation is not limited to the writing while alternately changing the direction, and it is also preferable to perform writing in the same direction when writing each stripe region 32. By one shot, a plurality of shot patterns maximally up to as many as the number of the holes 22 are formed at a time by the multiple beams having been formed by passing through the holes 22 in the shaping aperture array substrate 203.

Figure 12:
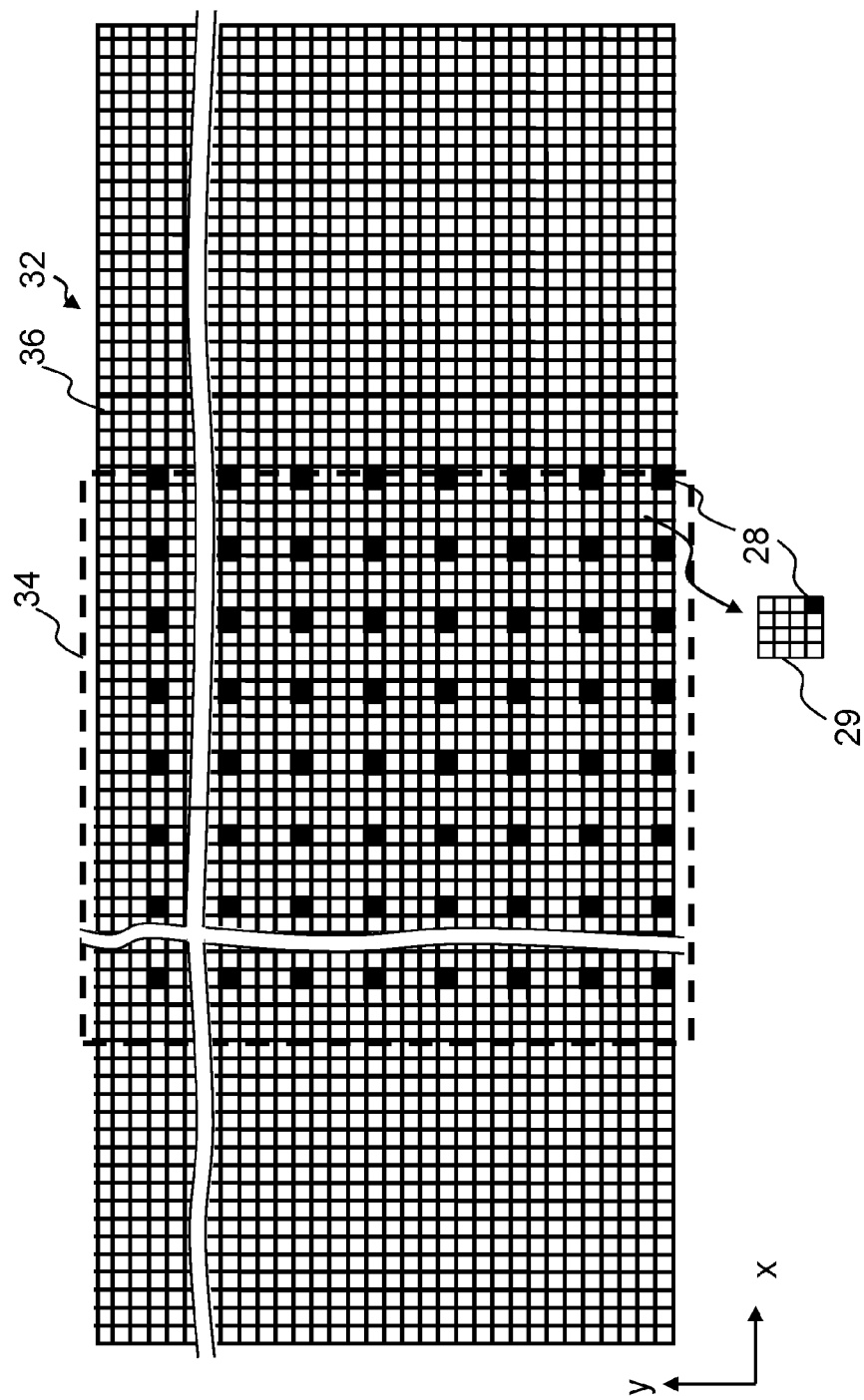
FIG. 12 shows an example of an irradiation region of multiple beams and a pixel to be written according to the first embodiment.

FIG. 12 shows an example of an irradiation region of multiple beams and a pixel to be written (writing target pixel) according to the first embodiment. In FIG. 12, the stripe region 32 is divided into a plurality of mesh regions by the beam size of each of the multiple beams 20, for example. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. FIG. 12 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the rectangular including square irradiation region 34 can be defined by (the number of beams in the x direction)×(beam pitch in the x direction). The y-direction size of the rectangular irradiation region 34 can be defined by (the number of beams in the y direction)×(beam pitch in the y direction). FIG. 12 shows the case of multiple beams of 512×512 (rows×columns) being simplified to 8×8 (rows× columns). In the irradiation region 34, there are shown a plurality of pixels 28 (beam writing positions) which can be irradiated with one shot of the multiple beams 20. The pitch between adjacent pixels 28 is the beam pitch of the multiple beams on the target object 101. A sub irradiation region 29 (pitch cell) is configured by a rectangular including square region surrounded by the size of beam pitches in the x and y directions. In the example of FIG. 12, each sub irradiation region 29 is composed of 4×4 pixels, for example. In each sub irradiation region 29, the writing sequence is set such that all the pixels 36 in each sub irradiation region 29 can be irradiated by irradiation of a plurality of beams.

In rasterization processing, with respect to the writing region 30, an area density p(x) map in which elements are defined for each pixel 36 is generated.

In the pattern density calculation step (S108), the pattern density P(x) calculation unit 62 calculates, for each stripe region 32, a pattern density P(x) depending on the position x in the stripe region 32 concerned. Alternatively, it is also preferable to divide each stripe region 32 into a plurality of sub-stripe regions and to perform calculation of a pattern density P(x) depending on the position x for each sub-stripe region. In other words, a pattern density P(x) depending on the position x in the sub-stripe region concerned is calculated for each sub-stripe region. As the pattern density P(x), an area density p(x) defined in the area density p(x) map may be used.

In the correction irradiation coefficient calculation step (S110), the correction irradiation coefficient d(x) calculation unit 63 calculates, for each pixel 36, a correction irradiation coefficient d(x) by multiplying the area density p(x) of a pattern by the dose modulation amount Dp(x). Then, the correction irradiation coefficient d(x) calculation unit 63 generates a correction irradiation coefficient d(x) map, in which elements are defined for each pixel 36, with respect to the writing region 30. For example, the dose of each pixel is determined by multiplying the correction irradiation coefficient d(x) by the base dose Db.

In the dose density calculation step (S112), the dose density P'(x) calculation unit 64 calculates, for each stripe region 32, a dose density P'(x) depending on the position x in the stripe region 32 concerned. Alternatively, a dose density P'(x) depending on the position x in the sub-stripe region concerned is calculated for each sub-stripe region. As the dose density P'(x), a correction irradiation coefficient d(x) defined in the correction irradiation coefficient d(x) map may be used.

In the shot data generation step (S114), the shot data generation unit 65 generates shot data of each shot of the multiple beams 20. Specifically, the shot data generation unit 65 generates shot data for each pixel 36. For example, in the counter system, a count value obtained by dividing the irradiation time of each beam to irradiate each pixel 36 by the count cycle (irradiation time resolution) of the counter circuit described above is generated as n-bit data. In the shot dividing system, data for one set of sub-shots is generated, where ON/OFF control signals each being a signal (1 bit) for selecting ON or OFF of each sub-shot are aligned for one set of sub-shots in the data. Then, the data processing unit 66 rearranges the generated shot data in the order of shots. The shot data (irradiation time data) is stored in the storage device 142.

In the ON-beam amount and center-of-gravity of ON-beam calculation step (S116) for each shot, the ON-beam amount B calculation unit 67 calculates, for each shot of the multiple beams 20, the total dose (ON-beam amount B) of ON-beams. The center-of-gravity calculation unit 68 calculates, for each shot of the multiple beams 20, the center of gravity Bc (Bcx, Bcy) of an ON-beam.

Figure 13A:
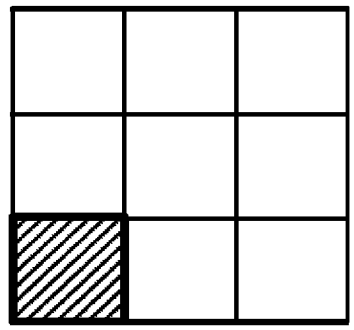
FIGS. 13A to 13C illustrate examples of the position of the center of gravity of an ON-beam according to the first embodiment.
Figure 13B:
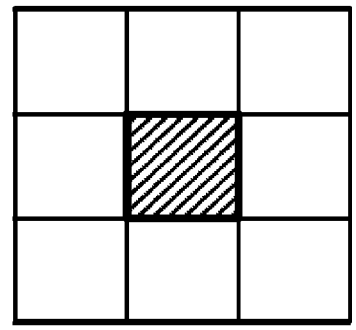
Figure 13C:
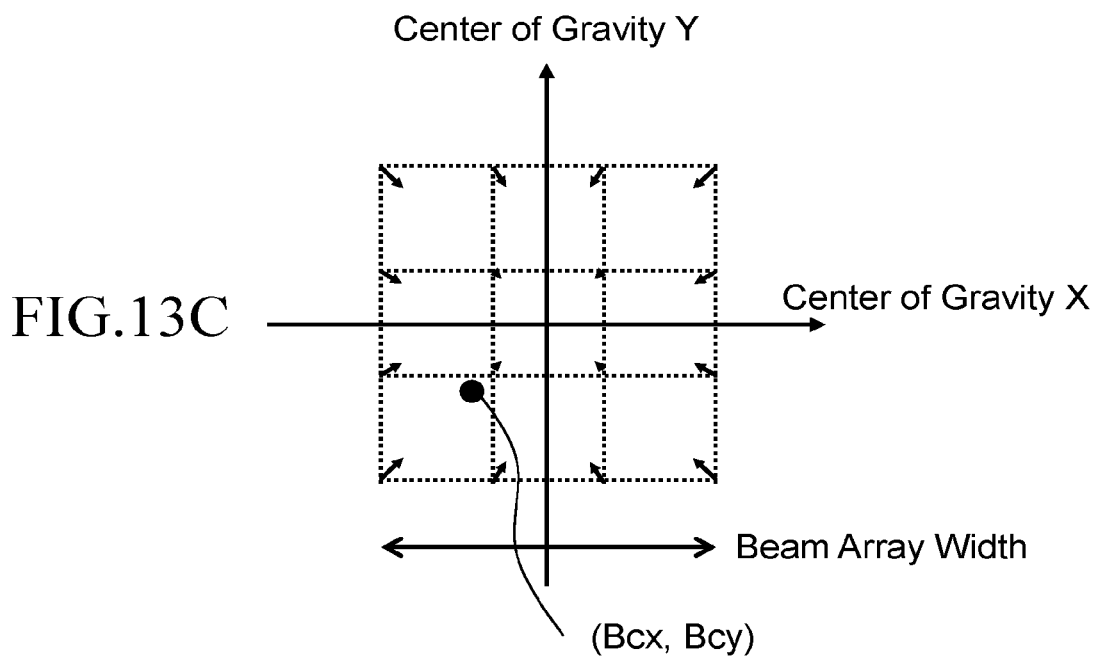

FIGS. 13A to 13C illustrate examples of the position of the center of gravity of an ON-beam according to the first embodiment. FIGS. 13A to 13C depict the case of 3×3 multiple beams. In FIG. 13A, the percentage of ON-beams in the multiple beams 20 is about 11%, and the position of ON-beam is one beam at the lower left. In FIG. 13B, the percentage of ON-beams in the multiple beams 20 is about 11%, and the position of ON-beam is one beam at the center. In the case of FIG. 13B, since only the center beam is ON-beam, the position of the center of gravity is the center position of the beam array of the multiple beams 20. On the other hand, in the case of FIG. 13A, since the lower left beam is ON-beam, the position of the center of gravity deviates diagonally toward the lower left of the center position of the beam array as shown in FIG. 13C.

FIGS. 14A to 14C illustrate other examples of the position of the center of gravity of an ON-beam according to the first embodiment. FIGS. 14A to 14C depict the case of 3×3 multiple beams. In FIG. 14A, the percentage of ON-beams in the multiple beams 20 is about 44%, and the positions of ON-beams are four beams at the upper center and in the left end column. In FIG. 14B, the percentage of ON-beams in the multiple beams 20 is about 44%, and the positions of ON-beams are four beams at the four corners. In the case of FIG. 14B, since the four beams at the four corners of the rectangle including square are ON-beams, the position of the center of gravity is the center position of the beam array of the multiple beams 20. On the other hand, in the case of FIG. 14A, since the four beams at the upper center and in the left end column are ON-beams, the position of the center of gravity deviates diagonally toward the upper left of the center position of the beam array as shown in FIG. 14C.

In the shift amount calculation step (S120) for each shot, the shift amount calculation unit 69 calculates a shift amount (Mx, My) of the multiple beams 20 of the k-th shot based on parameters related to the (k+1)th and subsequent shots (k being a natural number). Moreover, the shift amount calculation unit 69 calculates a shift amount (Gx, Gy) of the multiple beams 20 of the k-th shot based on parameters related to the (k−1)th and previous shots (k being a natural number). Moreover, the shift amount calculation unit 69 calculates a shift amount (Cx, Cy) of the multiple beams 20 of the k-th shot based on a parameter related to the k-th shot. Specifically, the shift amount calculation unit 69 reads correlation equation data from the storage device 144, and calculates a total shift amount (Dx, Dy) that is the sum of shift amounts defined by the following equations (1-1) and (1-2). That is, the total shift amount is calculated on the basis of a parameter which is based on parameters related to the (k+1)th and subsequent shots (k being a natural number), parameters related to the (k−1)th and previous shots (k being a natural number), and a parameter related to the k-th shot.

$$Dx=Gx(P)+Cx(B,Bcx,Bcy)+Mx(Tc,B) \tag{1-1}$$

$$Dy=Gy(P)+Cy(B,Bcx,Bcy)+My(Tc,B) \tag{1-2}$$

Here, Gx(P) may be defined as a function depending on the pattern density P(x) of a plurality of pixels 36 corresponding to irradiation positions of the multiple beams 20 of the (k−1)th shot, for example. Similarly, Gy(P) may be defined as a function depending on the pattern density P(x) of a plurality of pixels 36 corresponding to irradiation positions of the multiple beams 20 of the (k−1)th shot, for example.

Alternatively, it is more preferable that the shift amount (Gx, Gy) depends on the dose density P'(x) instead of the pattern density P(x). In that case, Gx(P') may be defined as a function depending on the dose density P'(x) of a plurality of pixels 36 corresponding to irradiation positions of the multiple beams 20 of the (k−1)th shot, for example. Similarly, Gy(P') may be defined as a function depending on the dose density P'(x) of a plurality of pixels 36 corresponding to irradiation positions of the multiple beams 20 of the (k−1)th shot, for example. Further, it is more preferable to use an average value of P(x) or that of P'(x) of from the (k−1)th to (k−m)th shots (m>1), or to use a weighted average of P(x) or that of P'(x), which uses a weight considering a charging time decay, of from the (k−1)th to (k−m)th shots (m>1).

Thus, as described above, a shift amount (Dx, Dy) for correcting the irradiation position of the shot concerned can be obtained for each shot by using a shift amount (Gx, Gy) resulting from a parameter associated with shot data of past shots, a shift amount Cx(B, Bcx, Bcy) resulting from a parameter associated with shot data of the shot concerned, and/or a shift amount My(Tc, B) resulting from a parameter associated with shot data of future shots. The shift amount (Dx, Dy) of each shot is calculated for each stripe region 32 or each sub-stripe region. After calculating the shift amount (Dx, Dy) of each shot in a writing target being the stripe region 32 or a sub-stripe region, writing is performed to the target, that is the stripe region 32 or the sub-stripe region is performed. The calculated shift amount (Dx, Dy) of each shot is stored in the storage device 142.

In the writing step (S130), the writing mechanism 150 performs the k-th shot onto the target object 101 with the multiple beams 20 while shifting, by collective deflection, all the multiple beams 20 of the k-th shot according to the calculated shift amount (Dx, Dy). First, under the control of the transmission control unit 79, the deflection control circuit 130 receives, in the order of shots, shot data (irradiation time data) and shift amount (Dx, Dy) data transmitted from the storage device 142. The writing mechanism 150 is controlled, at each shot, based on the shot data (irradiation time data) and the shift amount (Dx, Dy).

Next, operations of the writing mechanism 150 will be described. The electron beam 200 emitted from the electron gun 201 (emission source) almost perpendicularly (e.g., vertically) illuminates the whole of the shaping aperture array substrate 203 by the illumination lens 202. A plurality of rectangular (including square, etc.) holes 22 (openings) are formed in the shaping aperture array substrate 203. The region including all the plurality of holes 22 is irradiated with the electron beam 200. For example, rectangular (including square) multiple beams (a plurality of electron beams) 20 are formed by letting portions of the electron beam 200, which irradiates the positions of the plurality of holes 22, individually pass through a corresponding one of the plurality of holes 22 in the shaping aperture array substrate 203. The multiple beams 20 individually pass through corresponding blankers (first deflector: individual blanking mechanism 47) of the blanking aperture array mechanism 204. The blanker provides blanking control such that a corresponding electron beam individually passing becomes in an ON condition during a set writing time (irradiation time).

The multiple beams 20 having passed through the blanking aperture array mechanism 204 are reduced by the reducing lens 205, and go toward the hole in the center of the limiting aperture substrate 206. Then, the electron beam which was deflected by the blanker of the blanking aperture array mechanism 204 deviates (shifts) from the hole in the center of the limiting aperture substrate 206, and is blocked by the limiting aperture substrate 206. On the other hand, the electron beam which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF condition by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all the multiple beams 20 having passed through the limiting aperture substrate 206 are collectively deflected in the same direction by the main deflector 208 and the sub deflector 209 to irradiate respective beam irradiation positions on the target object 101. In each shot, all the multiple beams 20 are further deflected by the shift amount (Dx, Dy) of the shot concerned by the main deflector 208 or the sub deflector 209. Ideally, the multiple beams 20 irradiating at a time are aligned at the pitch obtained by multiplying the arrangement pitch of a plurality of holes 22 in the shaping aperture array substrate 203 by the desired reduction ratio described above.

FIGS. 15A and 15B show an example of shifting of multiple beams according to the first embodiment. As shown in FIG. 15A, an irradiation position 12 of each beam of the multiple beams 20 deviates, with a change amount different for each shot, from a design position 10 because of factors described above. According to the first embodiment, not by individually correcting the trajectory of each beam but by, for each shot, collectively shifting all the multiple beams 20 by the shift amount (Dx, Dy) for the shot concerned, the amount of positional deviation of the entire multiple beams 20 can be reduced as shown in FIG. 15B.

In the writing sequence controlled by the writing control unit 80, for example, when the XY stage 105 is continuously moving, tracking control is performed by the main deflector 208 so that the beam irradiation position may follow the movement of the XY stage 105. Then, each sub irradiation region 29 is deflected such that all the pixels 36 in the sub irradiation region 29 concerned can be irradiated with a plurality of pre-set beams. For example, in one tracking control when each sub irradiation region 29 is composed of 4×4 pixels 36 and all the pixels are irradiated with any four beams, one-fourth of pixels, that is four pixels, in each sub irradiation region 29 are written by, for example, four shots of one beam. By changing, for each tracking control, a beam to be emitted for irradiation, all the 4×4 pixels 36 can be irradiated by performing tracking control four times.

As described above, according to the first embodiment, each beam's positional deviation (shift) amount whose change amount varies for each shot in multi-beam writing can be reduced using parameters related to future shots or past shots.

Embodiments have been explained referring to specific examples described above. However, the present invention is not limited to these specific examples. For example, in the examples described above, with respect to the shift amount (Gx, Gy) resulting from parameters associated with shot data of past shots, Gx(P) and Gy(P) are defined, for example, as a function depending on the pattern density P(x) of a plurality of pixels 36 corresponding to irradiation positions of the multiple beams 20 of the (k−1)th shot, however, it is not limited thereto. For example, Gx(P) and Gy(P) may be defined as a function depending on a total value or an average value of the pattern density P(x) of a plurality of pixels 36 corresponding to irradiation positions of the multiple beams 20 of the (k−1)th shot. Alternatively, they may be defined as a function depending on the pattern density P(x) of all the pixels, or on a total value or an average value of the pattern density P(x) of all the pixels, in the irradiation region 34 of the multiple beams 20 of the (k−1)th shot. The same applies to the case in which a dose density P'(x) is used instead of the pattern density P(x). Further, may be used an average value of P(x) or that of P'(x), or a weighted average of P(x) or that of P'(x), which uses a weight considering a charging time decay, of from the (k−1)th to (k−m)th shots (m>1).

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam writing apparatus comprising:

a stage configured to be movable and to mount a substrate thereon;

a shot data generation circuit configured to generate shot data of each shot of multiple charged particle beams;

a shift amount calculation circuit configured to calculate a shift amount for collectively correcting positions of all of the multiple charged particle beams of a k-th shot, based on a parameter related to at least (k+1)th and subsequent shots (k being a natural number) of the multiple charged particle beams; and a writing mechanism including a deflector for deflecting the multiple charged particle beams, and the writing mechanism configured to perform the k-th shot onto the substrate with the multiple charged particle beams while shifting the all of the multiple charged particle beams of the k-th shot by collective deflection according to the shift amount.

2. The apparatus according to claim 1, wherein
the shift amount calculation circuit calculates the shift amount based on a further parameter related to (k−1)th and previous shots of the multiple charged particle beams, and the writing mechanism performs the k-th shot onto the substrate with the multiple charged particle beams while shifting the all of the multiple charged particle beams of the k-th shot by collective deflection according to the shift amount.

3. The apparatus according to claim 2, wherein
the shift amount calculation circuit calculates the shift amount based on a further parameter related to the k-th shot of the multiple charged particle beams, and the writing mechanism performs the k-th shot onto the substrate with the multiple charged particle beams while shifting the all of the multiple charged particle beams of the k-th shot by collective deflection according to the shift amount.

4. The apparatus according to claim 1, wherein
the shift amount calculation circuit calculates the shift amount based on a further parameter related to the k-th shot of the multiple charged particle beams, and the writing mechanism performs the k-th shot onto the substrate with the multiple charged particle beams while shifting the all of the multiple charged particle beams of the k-th shot by collective deflection according to the shift amount.

5. The apparatus according to claim 1, wherein, as the parameter, a combination of a shot cycle and an ON-beam amount of the multiple charged particle beams to be used in the (k+1)th and subsequent shots is used.

6. A multi-charged particle beam writing apparatus comprising:

a stage configured to be movable and to mount a substrate thereon;

a shot data generation circuit configured to generate shot data of each shot of multiple charged particle beams;

a shift amount calculation circuit configured to calculate a shift amount for collectively correcting positions of all of the multiple charged particle beams of a k-th shot, based on a parameter related to at least (k−1)th and previous shots (k being a natural number) of the multiple charged particle beams; and a writing mechanism including a deflector for deflecting the multiple charged particle beams, and the writing mechanism configured to perform the k-th shot onto the substrate with the multiple charged particle beams while shifting the all of the multiple charged particle beams of the k-th shot by collective deflection according to the shift amount.

7. The apparatus according to claim 6, wherein
the shift amount calculation circuit calculates the shift amount based on a further parameter related to the k-th shot of the multiple charged particle beams, and the writing mechanism performs the k-th shot onto the substrate with the multiple charged particle beams while shifting the all of the multiple charged particle beams of the k-th shot by collective deflection according to the shift amount.

8. The apparatus according to claim 6, wherein, as the parameter, one of a pattern density and a dose density at irradiation positions of the multiple charged particle beams having been used in the (k−1)th and previous shots is used.

9. A multi-charged particle beam writing method comprising:

generating shot data of each shot of multiple charged particle beams;

calculating a shift amount for collectively correcting positions of all of the multiple charged particle beams of a k-th shot, based on a parameter related to at least (k+1)th and subsequent shots (k being a natural number) of the multiple charged particle beams; and performing the k-th shot onto a substrate placed on a movable stage with the multiple charged particle beams while shifting the all of the multiple charged particle beams of the k-th shot by collective deflection according to the shift amount.

10. The method according to claim 9, wherein
the shift amount is calculated based on a further parameter related to (k−1)th and previous shots (k being a natural number) of the multiple charged particle beams, and the k-th shot is performed onto the substrate with the multiple charged particle beams while shifting the all of the multiple charged particle beams of the k-th shot by collective deflection according to the shift amount.

11. The method according to claim 9, wherein
the shift amount is calculated based on a further parameter related to the k-th shot of the multiple charged particle beams, and the k-th shot is performed onto the substrate with the multiple charged particle beams while shifting the all of the multiple charged particle beams of the k-th shot by collective deflection according to the shift amount.

* * * * *